United States Patent
Cordes et al.

(10) Patent No.: US 7,260,671 B2
(45) Date of Patent: Aug. 21, 2007

(54) INFORMATION CONTAINING MEANS FOR MEMORY MODULES AND MEMORY CHIPS

(75) Inventors: Eric Cordes, München (DE); Christian Stocken, München (DE); Nazif Taskin, München (DE); Norbert Wirth, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 234 days.

(21) Appl. No.: 10/278,232

(22) Filed: Oct. 23, 2002

(65) Prior Publication Data

US 2003/0081444 A1 May 1, 2003

(30) Foreign Application Priority Data

Oct. 26, 2001 (DE) ................. 101 52 916

(51) Int. Cl.
*G06K 19/10* (2006.01)
(52) U.S. Cl. ............................ 711/103
(58) Field of Classification Search ............ 711/2, 711/5, 101, 102, 103, 104, 156, 170
See application file for complete search history.

(56) References Cited

U.S. PATENT DOCUMENTS

| | | | | |
|---|---|---|---|---|
| 5,446,860 A | * | 8/1995 | Dresser et al. | 711/100 |
| 5,539,912 A | * | 7/1996 | Clarke et al. | 710/104 |
| 5,875,248 A | * | 2/1999 | Lewis | 713/168 |
| 5,920,504 A | * | 7/1999 | Lee et al. | 365/185.11 |
| 5,937,423 A | | 8/1999 | Robinson | 711/103 |
| 5,995,405 A | | 11/1999 | Trick | 365/63 |
| 6,041,008 A | * | 3/2000 | Marr | 365/225.7 |
| 6,201,753 B1 | * | 3/2001 | Akaogi et al. | 365/226 |
| 6,625,692 B1 | * | 9/2003 | Stubbs et al. | 711/115 |

FOREIGN PATENT DOCUMENTS

JP      59124098 A      7/1984

OTHER PUBLICATIONS

OKIPAGE 10i User's Guide, "features" page on 4MB Memory SIMM Chip (Part # 70028801), Mar. 1998.*
Google search results using "SIMM chip" as the searching keyword.*

* cited by examiner

*Primary Examiner*—Pierre Bataille
*Assistant Examiner*—Sheng-Jen Tsai
(74) *Attorney, Agent, or Firm*—Laurence A. Greenberg; Werner H. Stemer; Ralph E. Locher

(57) ABSTRACT

A memory module includes at least one memory chip arranged on the memory module. Information about the memory module and/or the at least one memory chip arranged on the memory module can be stored directly on the memory chip, making use of a suited element, fuses or flip-flops, for example. A memory chip contains such an element for containing information relating to the memory chip and/or a memory module with which the memory chip is compatible, wherein the information containing element can be read out by means of an external processor.

9 Claims, 1 Drawing Sheet

INFORMATION CONTAINING MEANS FOR MEMORY MODULES AND MEMORY CHIPS

FIELD OF THE INVENTION

The present invention relates to information containing means for memory modules and memory chips, and in particular to a memory module or a memory chip, respectively, including such information containing means.

BACKGROUND OF THE INVENTION AND PRIOR ART

In today's memory realizations, information is stored in an additional element on the circuit board of the memory module via a memory module or memory chip of the memory module, respectively, this additional element having the form of an EEPROM and being known under this term for the above-mentioned purpose in the context of memory architectures. The information stored in the EEPROM, on the one hand, relates to chip parameters, such as, for example, the number of X and Y addresses, timing parameters and the size of the module, and, on the other hand, to manufacturer-specific data, such as, for example, name of the company, production site, test program version and date of manufacture. In the first test of the memory module, this data is stored into the EEPROM and, after that, will never be changed.

This fundamental well-known architecture is schematically shown in FIG. 2. In FIG. 2, a memory environment 10 is shown, which can, for example, be a computer. In addition, the reference numeral 12 designates a memory module on which a memory chip 14 is arranged. An information EEPROM is also arranged on the board of the memory module 12, as has been described above, the EEPROM storing information relating to the module 12 or the chip 14, respectively. In addition, a chip set 18 which can, for example, be formed by chips on the motherboard is shown in FIG. 2, the chips enabling communication between the memory module 12 or the memory chip 14, respectively, and a processor. The chip set 18 is also designed to send read commands via an associated command line 20 to the EEPROM 16 and, responsive thereto, to receive data via a corresponding data line 22 from the EEPROM.

According to data received by the EEPROM, the chip set 18 then controls communication with the memory module 12 or the memory chip arranged thereon, respectively, a plurality of memory chips usually being arranged on a memory module. It is obvious for those skilled in the art what the respective communication between the chip set and the memory module or the memory chip, respectively, is like, no further explanation being required for this.

It is a disadvantage of the solution shown in FIG. 2 that the additional element on the board of the memory module 12, that is the EEPROM 16, on the one hand requires space and on the other hand causes additional costs of purchasing and mounting same. In addition, the EEPROM is susceptible to errors so that reliability problems may arise.

SUMMARY OF THE INVENTION

It is the object of the present invention to provide a memory module and a memory chip, which enable a cheap and reliable storage of memory module or memory chip information, respectively.

In accordance with a first aspect of the invention this object is achieved by a memory module having at least one memory chip arranged on the memory module; and
information containing means containing information relating to the memory module and/or the at least one memory chip arranged on the memory module, the information containing means being arranged on the memory chip.

According to a second aspect of the present invention this object is achieved by a memory chip having information containing means for containing information relating to the memory chip and/or the memory module with which the memory chip is compatible, wherein the information containing means can be read out by means of an external processor.

According to the invention, the storage of module relevant parameters is shifted from an external element, namely the EEPROM, to the memory chips so that an element on the board of the memory module can be omitted. The present invention thus shifts the information to the interior of the memory chips which are arranged on the board of the memory module anyway. In addition, suitable circuit arrays being able to store the corresponding amount of information are required on the chips. These circuits can be accommodated in areas of the memory chips otherwise unused. In addition, they can be produced in the lithography steps which are required anyway and are thus incorporated in the mask set. Thus, in contrast to an EEPROM, no additional costs arise since no additional element has to be produced or purchased and mounted. Additionally, the reliability of the memory arrangement is increased by omitting this additional element since the EEPROM susceptible to errors is omitted.

BRIEF DESCRIPTION OF THE DRAWINGS

Preferred embodiments of the present invention will be detailed subsequently referring to the appended drawings in which.

DETAILED DESCRIPTION OF THE PREFERRED EMBODIMENT

Figure 1:
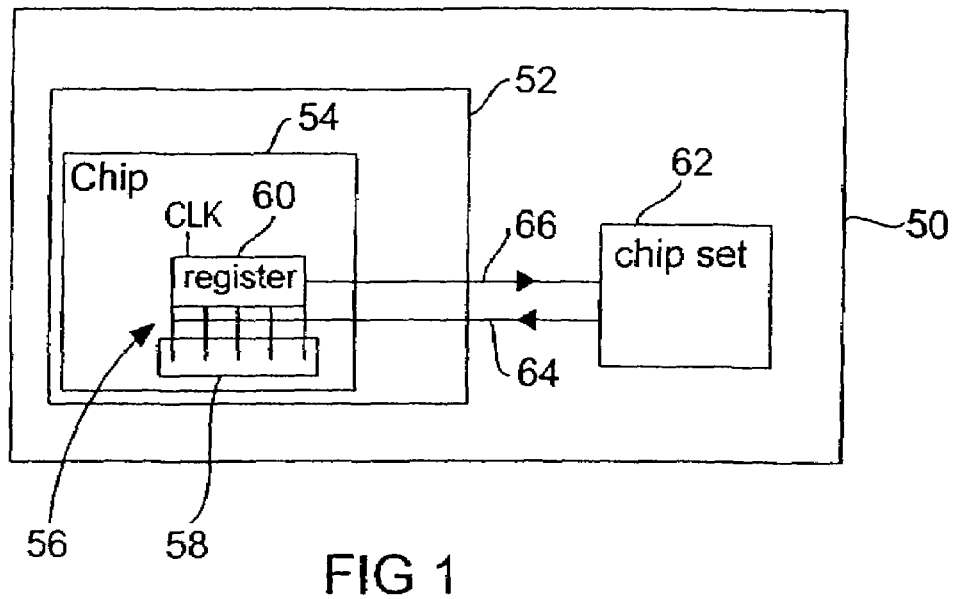
FIG. 1 shows a schematic illustration showing a memory environment in which an inventive memory module is used.

A memory environment 50 in which the present invention is realized is shown in FIG. 1. The memory environment 50 can, for example, be a computer. A memory chip 54 is arranged on a memory module 52, i.e. on a board of it. Although only one memory chip 54 is shown in FIG. 1, it is obvious for those skilled in the art that a plurality of memory chips are usually arranged on the board 52 of a memory module.

Information containing means 56 storing information which, according to the prior art, is stored in the additional element EEPROM is provided on the memory chip 54. This information on the one hand includes operational parameters of the memory module or the memory chips arranged thereon and on the other hand manufacturer-specific data. The operational parameters include the size of the memory chips including the number of X and Y addresses, timing parameters and the size of the module. The manufacturer-specific data can, among others, relate to the name of the company, the production site, the test program version and the date of manufacture of the corresponding module.

In the embodiment shown in FIG. 1, the information containing means 56 is based on eFuse technology. For this purpose a fuse bank 58 containing a plurality of electrical fuses (eFuses) is provided, wherein binary information can be stored at each fuse by applying an overvoltage or an overcurrent. From that point of view, an electrical fuse behaves like a laser fuse, is, however, of more advantage in that no laser is required and the fusing process can still be effected when the memory chip has been received in a casing. In addition, a register 60 associated to the fuse bank 58 is provided, in which information from the fuses is stored. Information containing means 56 in turn, via suitable communication connections, is connected to a chip set 62 which can be identical to the chip set 18 described referring to FIG. 2 and can control communication between the memory chip or the memory module, respectively, and an external processor, for example, on the mother board of a computer. As is shown in FIG. 1, the chip set 62 is connected to information containing means via a command interface 64 and a data interface 66.

Figure 2:
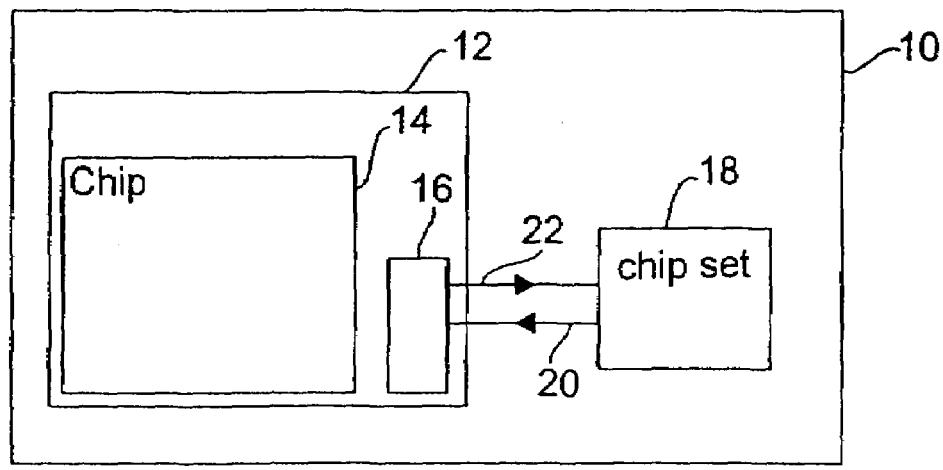
FIG. 2 shows a memory environment according to the prior art.

Responsive to a corresponding system command which is, for example, effected by entering the test mode and is issued by the chip set 62, the fuses or registers, respectively, in which information from the fuses is stored are read out, the corresponding command being transmitted to information containing means 56 via the command interface 64. The read out takes place via the data interface 66, wherein the respective register bits are output sequentially and synchronously to the system clock CLK for this. Based on the data obtained, the settings for the response of the memory cells are set by the chip set 62. This takes place in a conventional way, as is the case with the information obtained from the EEPROM 16 according to the prior art (FIG. 2).

Information containing means 56 must be able to store the corresponding amount of information. In a conventional EEPROM as is designated in FIG. 2 by the reference numeral 16, 128 bytes from the producer and, sometimes, another 128 bytes from the purchaser, that is a total amount of 256 bytes of information, are stored. The smallest memory modules realized in practice have four memory chips so that, when the information of 256 bytes is distributed among the four chips, at most 64 bytes per chip, corresponding to 512 bits of information, have to be stored. The circuits required for this can easily be accommodated in areas otherwise unused.

As has been illustrated in the description of the preferred embodiment, eFuse technology can advantageously be used for this. Having an array of 512 electrical fuses (eFuses) per chip, the amount of data required can be stored. Programming the eFuses is effected by applying a corresponding overvoltage to the fuse, as has been mentioned above.

Alternatively, a storage in corresponding flip-flops is also feasible, wherein the demand of space, however, is probably larger than in the case in which electrical fuses are used.

What is claimed is:

1. A memory module comprising:
a plurality of memory chips arranged on the memory module; and
information containing means containing a common set of information relating to the memory module and/or the memory chips arranged on the memory module, said common set of information being valid for all of the plurality of memory chips;
said information containing means being arranged on the memory chips;
said common set of information contained in the information containing means relating to operational parameters of the memory module or the memory chips and/or to manufacturer-specific data of the memory module and/or the memory chips; and
said information containing means being distributed among the plurality of memory chips so that each memory chip has stored thereon, different information of said common set of information, such that the different information distributed among the plurality of memory chips, when taken together, forms the complete common set of information.

2. The memory module according to claim 1, wherein the information containing means comprises fuses for permanently programming information.

3. The memory module according to claim 1, wherein the information containing means comprises flip-flops.

4. A memory module comprising:
a plurality of memory chips arranged on the memory module; and
information containing means containing a common set of information relating to the memory module and the memory chips arranged on the memory module, said common set of information being valid for all of the plurality of memory chips;
said information containing means being arranged on the memory chips;
said common set of information contained in the information containing means relating to operational parameters of the memory module or the memory chips and/or to manufacturer-specific data of the memory module and/or the memory chips; and
said information containing means being distributed among the plurality of memory chips so that each memory chip has stored thereon, a different fraction of said common set of information, such that the fractions taken together form the complete common set of information.

5. The memory module according to claim 4, wherein the information containing means includes fuses for permanently programming information.

6. The memory module according to claim 4, wherein the information containing means includes flip-flops.

7. A memory module comprising:
a plurality of memory chips arranged on the memory module; and
information containing means containing a common set of information relating to the memory module and/or the memory chips arranged on the memory module, said common set of information being valid for all of the plurality of memory chips;
said information containing means being arranged on the memory chips;
said common set of information contained in the information containing means including manufacturerspecific data of the memory module and/or the memory chips; and
said information containing means being distributed among the plurality of memory chips so that each memory chip has stored thereon, a different fraction of said common set of information, such that the fractions taken together form the complete common set of information.

8. The memory module according to claim 7, wherein the information containing means includes fuses for permanently programming information.

9. The memory module according to claim 7, wherein the information containing means includes flip-flops.

* * * * *